(12) United States Patent
Waite et al.

(10) Patent No.: US 7,521,380 B2
(45) Date of Patent: Apr. 21, 2009

(54) METHODS FOR FABRICATING A STRESS ENHANCED SEMICONDUCTOR DEVICE HAVING NARROW PITCH AND WIDE PITCH TRANSISTORS

(75) Inventors: Andrew M. Waite, Radebeul/Dresden (DE); Scott Luning, Poughkeepsie, NY (US); Frank (Bin) Yang, Mahwah, NJ (US)

(73) Assignee: Advanced Micro Devices, Inc., Austin, TX (US)

( * ) Notice: Subject to any disclaimer, the term of this patent is extended or adjusted under 35 U.S.C. 154(b) by 128 days.

(21) Appl. No.: 11/738,828

(22) Filed: Apr. 23, 2007

(65) Prior Publication Data

US 2008/0261408 A1    Oct. 23, 2008

(51) Int. Cl.
*H01L 21/31* (2006.01)
*H01L 21/469* (2006.01)

(52) U.S. Cl. ............ 438/786; 438/792; 438/763; 257/E21.487; 257/E21.619

(58) Field of Classification Search ............ 438/786, 438/792, 740, 759, 763, 902, 947, 950, 496; 257/E21.37, E21.619, E21.626, E21.64, E21.487, 257/E21.4

See application file for complete search history.

(56) References Cited

U.S. PATENT DOCUMENTS

| | | | |
|---|---|---|---|
| 2007/0252230 A1* | 11/2007 | Zhu et al. | 257/499 |
| 2008/0179638 A1* | 7/2008 | Dyer et al. | 257/288 |
| 2008/0237720 A1* | 10/2008 | Doris et al. | 257/351 |

* cited by examiner

*Primary Examiner*—Caridad M Everhart
(74) *Attorney, Agent, or Firm*—Ingrassia Fisher & Lorenz, P.C.

(57) ABSTRACT

A method is provided for fabricating a semiconductor device on a semiconductor substrate. A plurality of narrow gate pitch transistors (NPTs) and wide gate pitch transistors (WPTs) are formed on and in the semiconductor substrate. The NPTs are spaced apart by a first distance, and the WPTs are spaced apart by a second distance greater than the first distance. A first stress liner layer is deposited overlying the NPTs, the WPTs and the semiconductor layer, an etch stop layer is deposited overlying the first stress liner layer, and a second stress liner layer is deposited overlying the etch stop layer. A portion of the second stress liner layer which overlies the WPTs is covered, and an exposed portion of the second stress liner layer which overlies the NPTs is removed to expose an exposed portion of the etch stop layer. The exposed portion of the etch stop layer which overlies the NPTs is removed.

18 Claims, 15 Drawing Sheets

METHODS FOR FABRICATING A STRESS ENHANCED SEMICONDUCTOR DEVICE HAVING NARROW PITCH AND WIDE PITCH TRANSISTORS

TECHNICAL FIELD

The present invention generally relates to semiconductor devices and to methods for their fabrication, and more particularly relates to methods for fabricating stress enhanced semiconductor devices having narrow gate pitch transistors and wide gate pitch transistors.

BACKGROUND

The majority of present day integrated circuits (ICs) are implemented by using a plurality of interconnected field effect transistors (FETs), also called metal oxide semiconductor field effect transistors (MOSFETs), or simply MOS transistors. A MOS transistor includes a gate electrode as a control electrode, and a pair of spaced apart source and drain electrodes. A control voltage applied to the gate electrode controls the flow of a current through a channel between the source and drain electrodes.

The complexity of ICs and the number of devices incorporated in ICs are continually increasing. As the number of devices in an IC increases, the size of individual devices decreases. Device size in an IC is usually noted by the minimum feature size; that is, the minimum line width or the minimum spacing that is allowed by the circuit design rules. As the semiconductor industry moves to a minimum feature size of 45 nanometers (nm) and even smaller, the gain of performance due to scaling becomes limited. As new generations of integrated circuits and the MOS transistors that are used to implement those ICs are designed, technologists must rely heavily on non-conventional elements to boost device performance.

The performance of a MOS transistor, as measured by its current carrying capability, is proportional to the mobility of a majority carrier in the transistor's channel. By applying an appropriate uniaxial stress to the channel of the MOS transistor, the mobility of the majority carrier in the channel can be increased which increases drive current thereby improving performance of the MOS transistor. For example, applying a compressive uniaxial stress to the channel of a P-channel MOS (PMOS) transistor enhances the mobility of majority carrier holes, whereas applying a tensile uniaxial stress to the channel of an N-channel MOS (NMOS) transistor enhances the mobility of majority carrier electrons. The known stress engineering methods greatly enhance circuit performance by increasing device drive current without increasing device size and device capacitance.

Stress applied along the channel of the MOS transistor can be increased by providing a stress liner layer over the transistor which imparts stress along the channel. For a given spacing or "repeat distance" between adjacent transistors, the amount of stress applied to the channel is roughly proportional to the thickness of the stress liner layer up to a certain limit, at which point the amount of stress remains substantially the same regardless of further increases in thickness of the stress liner layer. In other words, the amount of stress applied to the channel saturates after a certain thickness.

Ideally, the stress liner layer is deposited so that it conforms to the surface of the gate electrodes and surfaces between adjacent gate electrodes such that the stress liner layer includes canyon-like regions between adjacent gate electrodes. However, when the thickness of the stress liner layer is greater than a certain thickness, a phenomenon known as "bridging" can occur where the canyon-like regions "close" and are also filled by the stress liner material. In other words, when bridging occurs, the stress liner material bridges a gap between adjacent gate electrodes. Increasing the thickness of the stress liner layer beyond a thickness where bridging begins to occur is of little value, if any, since the amount of stress tends to saturate beyond this thickness. In other words, as the thickness of the stress liner layer increases to the point where bridging starts and the canyon-like regions between adjacent gate electrodes begin to close, increases in device performance due to the stress liner layer tend to saturate, and therefore, there is no reason to increase the thickness of the stress liner layer beyond a certain thickness. Bridging becomes particularly problematic as the "gate pitch" or repeat distance between gate electrodes of adjacent MOS transistors decreases, which is desirable when attempting to decrease layout area. To help avoid bridging of the stress liner layer, one approach is to simply reduce the thickness of the stress liner layer.

Some integrated circuits include both narrow gate pitch transistors and wide gate pitch transistors. Narrow gate pitch transistors have a gate pitch which is less than that of the wide gate pitch transistors. Wide gate pitch transistors are generally provided in such a semiconductor device to provide transistors with improved performance in comparison to narrow gate pitch transistors. Wide gate pitch transistors have more stress line material between adjacent gate electrodes and this allows for a higher level of stress to be applied along the channels of these wide pitch transistors. With respect to wide gate pitch transistors, the thickness of the stress liner layer that can be deposited before bridging occurs is substantially greater since the spacing between adjacent gate electrodes is greater for wide gate pitch transistors. Therefore more stress liner material can be applied over the wide gate pitch transistors before the gap between adjacent gate electrodes is bridged by the stress liner layer. This helps to increase stress applied to the channel of the wide gate pitch transistors. However, when the narrow gate pitch transistors are also present, the thickness of the stress liner layer can not be increased too much since it would cause bridging with respect to the narrow gate pitch transistors.

Accordingly, it is desirable to provide improved methods for fabricating a stress enhanced semiconductor device which includes both narrow gate pitch transistors and wide gate pitch transistors. Furthermore, other desirable features and characteristics of the present invention will become apparent from the subsequent detailed description and the appended claims, taken in conjunction with the accompanying drawings and the foregoing technical field and background.

BRIEF SUMMARY

In accordance with one embodiment, a method is provided for fabricating a semiconductor device on a semiconductor substrate. A plurality of narrow gate pitch transistors and wide gate pitch transistors are formed on and in the semiconductor substrate. The narrow gate pitch transistors are spaced apart by a first distance, and the wide gate pitch transistors are spaced apart by a second distance greater than the first distance. A first stress liner layer is deposited overlying the narrow gate pitch transistors, the wide gate pitch transistors and the semiconductor layer. An etch stop layer is deposited overlying the first stress liner layer, and a second stress liner layer is deposited overlying the etch stop layer. A portion of the second stress liner layer which overlies the wide gate pitch transistors is covered, and an exposed portion of the second stress liner layer which overlies the narrow gate pitch transistors is removed to expose an exposed portion of the etch stop layer. The exposed portion of the etch stop layer which overlies the narrow gate pitch transistors is removed. As such, a semiconductor device fabricated according to this method has enhanced stress over the wide gate pitch transistors without causing bridging issues with respect to the narrow gate pitch transistors.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. The word "exemplary" is used herein to mean "serving as an example, instance, or illustration." Any embodiment described herein as "exemplary" is not necessarily to be construed as preferred or advantageous over other embodiments. All of the implementations described below are exemplary implementations provided to enable persons skilled in the art to make or use the invention and are not intended to limit the scope of the invention which is defined by the claims. Furthermore, there is no intention to be bound by any expressed or implied theory presented in the preceding technical field, background, brief summary or the following detailed description.

FIGS. 1-15 illustrate, in cross section, a portion of a stress enhanced semiconductor device 30 and method steps for its fabrication in accordance with various embodiments of the invention. Those of skill in the art will understand that the semiconductor device 30 can be part of an integrated circuit generally includes a large number of transistors that are interconnected to perform a particular circuit function being implemented. In these illustrative embodiments the exemplary MOS transistors 31-35 will be described as being P-channel MOS (PMOS) transistors, although similar method steps can be used to manufacture N-channel MOS (NMOS) transistors as will be explained below. Likewise, similar method steps can used to manufacture complementary MOS (CMOS) circuits that include a plurality of NMOS and/or PMOS transistors with or without conventional MOS transistors, all coupled together to implement a desired integrated circuit. Many different integrated circuits (ICs) can be formed with the semiconductor device 30, and such ICs can include a large number of MOS transistors.

Various steps in the manufacture of MOS transistors are well known and so, in the interest of brevity, many conventional steps will only be mentioned briefly herein or will be omitted entirely without providing the well known process details. Although the term "MOS transistor" properly refers to a device having a metal gate electrode and an oxide gate insulator, that term will be used throughout to refer to any semiconductor device that includes a conductive gate electrode (whether metal or other conductive material) that is positioned overlying a gate insulator (whether oxide or other insulator) which, in turn, is positioned overlying a semiconductor substrate (whether silicon or other semiconductor material).

Figure 1:
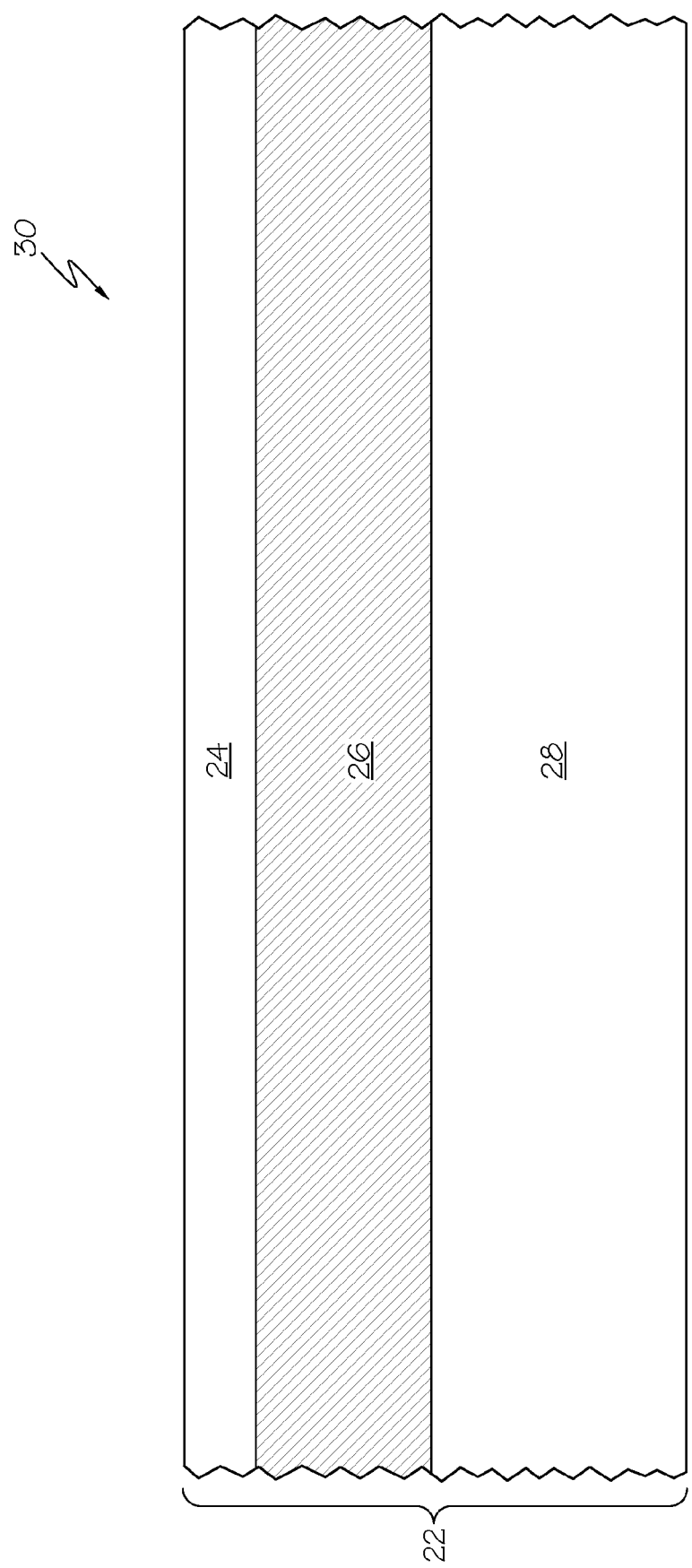
FIGS. 1-15 illustrate, in cross section, a stressed enhanced semiconductor device and method steps for its fabrication in accordance with various embodiments of the invention.
Figure 2:
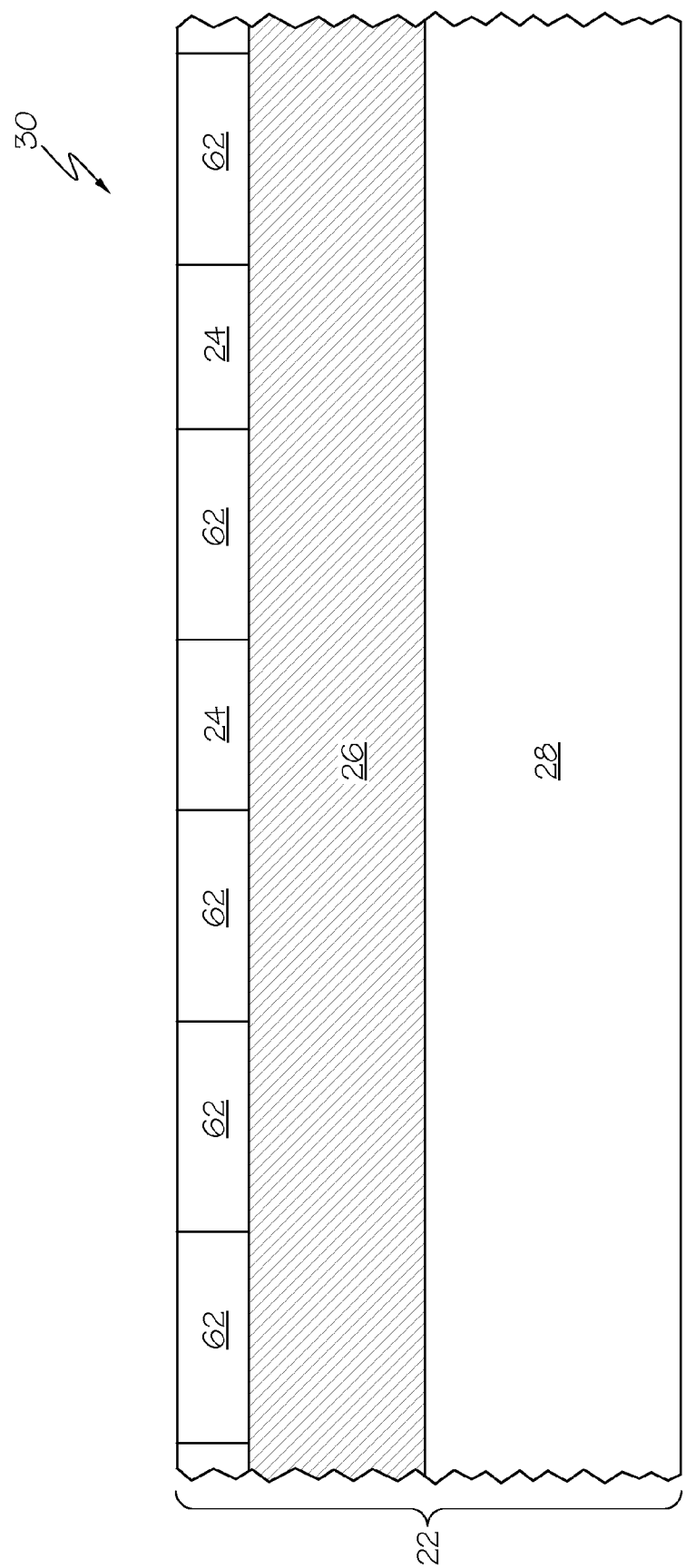

As illustrated in FIG. 1, the manufacture in accordance with an embodiment of the invention begins with providing a semiconductor structure 22 in and on which MOS transistors will be fabricated. The semiconductor structure 22 can be either a bulk semiconductor material or a semiconductor-on-insulator (SOI) structure 22 as illustrated in the embodiments of FIGS. 1-15. The SOI structure 22 illustrated in FIG. 1 comprises at least one thin layer of semiconductor material 24 disposed on or overlying a buried oxide insulating layer 26 which, in turn, is supported by a carrier wafer or substrate 28 so that the buried oxide insulating layer 26 is disposed between the carrier wafer 28 and the semiconductor layer 24. The semiconductor layer 24 can be a thin silicon layer, a germanium layer, a gallium arsenide layer, or other semiconductor materials. In one embodiment, the semiconductor material layer 24 comprises a thin monocrystalline layer of silicon on the buried oxide insulating layer 26. For instance, in the particular embodiment of FIGS. 1-15, the thin monocrystalline layer of silicon can be a silicon substrate having a <011> or <110> surface crystal orientation which are preferred crystallographic orientations when fabricating PMOS devices. The thin silicon layer preferably has a resistivity of at least about 1-35 Ohms per square. The thin silicon layer may be a relatively pure silicon material, or a layer of silicon material doped with impurity dopant elements such as boron, phosphorus, and arsenic, to form a substantially monocrystalline semiconductor material. In one embodiment, the buried oxide insulating layer 26 can be, for example, a silicon dioxide layer, which preferably has a thickness of about 50-200 nm.

An optional protective oxide layer (not shown) can be deposited overlying the semiconductor layer 24 to protect the semiconductor layer 24 from damage and to help control implantation depth during subsequent implantation steps. In one embodiment, the protective oxide layer (not shown) can be, for example, a silicon dioxide ($SiO_2$) layer, which preferably has a thickness of about 10-20 nm.

The semiconductor layer 24 can be impurity doped either with N-type conductivity determining impurities or P-type conductivity determining impurities depending on the conductivity type of the MOS transistors being fabricated. In the PMOS embodiment illustrated in FIG. 2, the semiconductor layer 24 can be doped with N-type conductivity determining impurities to create N-well regions 62 in the semiconductor layer 24. Impurity doping can take place, for example, by the implantation and subsequent thermal annealing of dopant ions such as phosphorus and arsenic.

Figure 3:
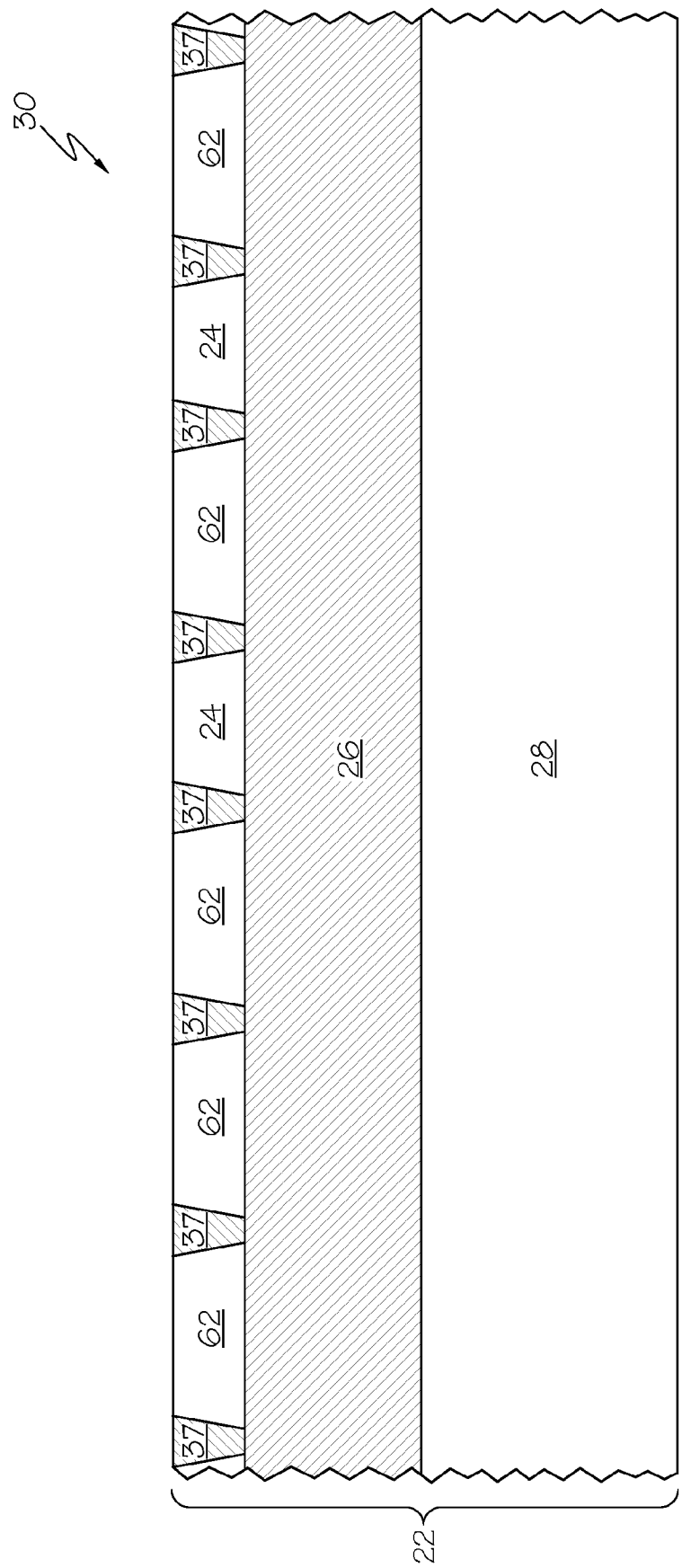

As illustrated in FIG. 3, once the N-well region 62 is formed, dielectric isolation regions 37 are formed in the semiconductor layer 24 which are designed to isolate between adjacent MOS transistors 31-35. There are many known processes that can be used to form the dielectric isolation regions 37, so the process need not be described here in detail. One process for forming the dielectric isolation regions 37 is a shallow trench isolation (STI) process. In general, STI processes involve selectively removing portions of the protective oxide layer (not shown), and etching shallow trenches into the surface of the semiconductor layer 24 which are subsequently filled with an insulating material. After the trenches are filled with an insulating material, such as an oxide, the surface is usually planarized, for example by chemical mechanical planarization (CMP).

Figure 4:
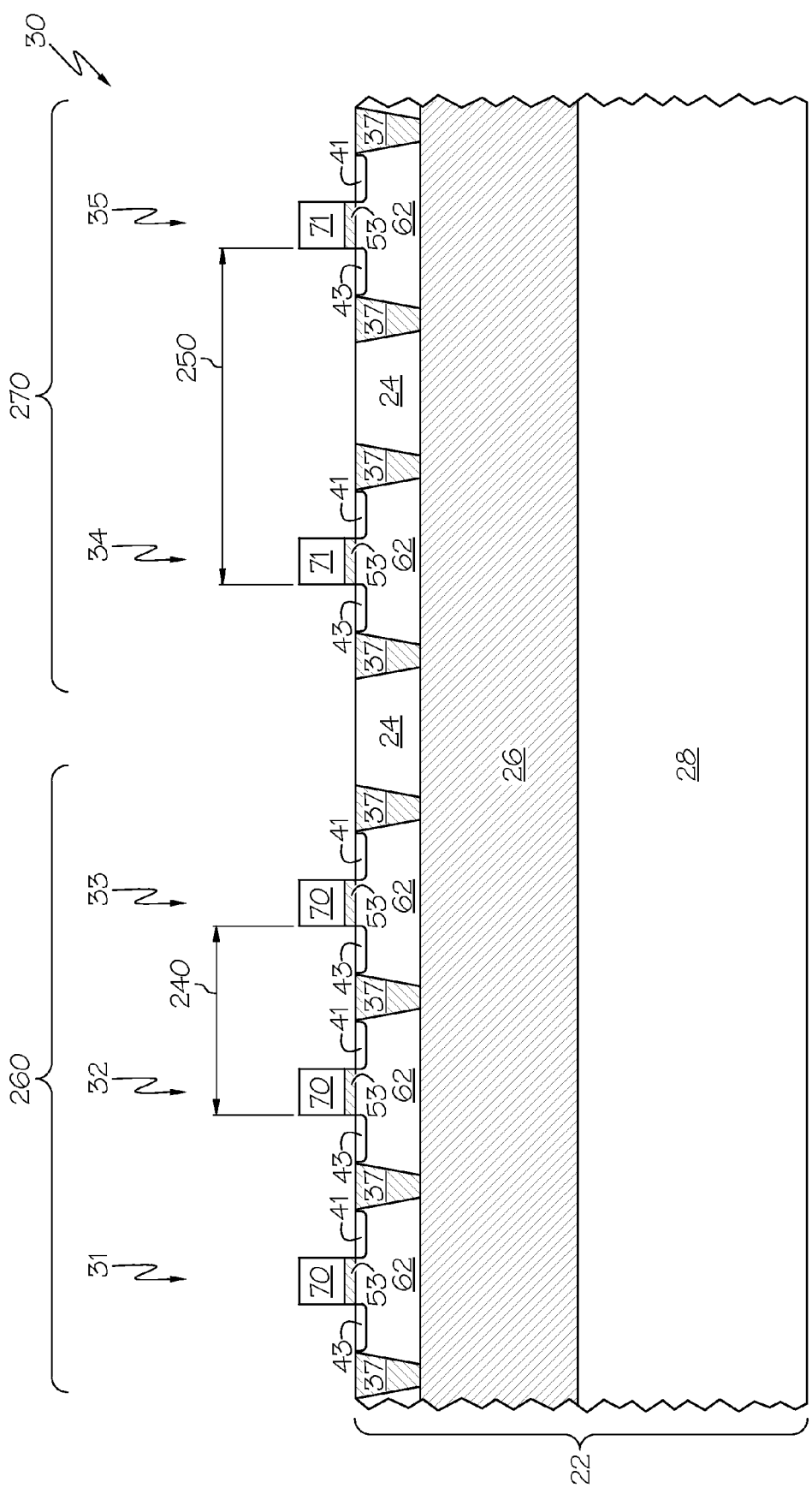

As illustrated in FIG. 4, a layer of gate insulating material 53 is formed overlying the impurity-doped N-well regions 62 and gate electrodes 70, 71 are formed overlying the gate insulating material 53 and impurity-doped N-well region 62, respectively. The gate electrodes 70, 71 each define a channel

64, 66 of their respective transistors 31-35. The layer of gate insulating material 53 can be a layer of thermally grown silicon dioxide or, alternatively, a deposited insulator such as silicon oxide, silicon nitride, or a high dielectric constant (κ) insulator material having a high dielectric constant (κ) relative to silicon dioxide. Examples of "high-κ dielectric" materials include hafnium and zirconium silicates, and their oxides, including, but not limited to, hafnium oxide (HfO$_2$), hafnium silicate (HfSiO), or the like. Deposited insulators can be deposited, for example, by chemical vapor deposition (CVD), low pressure chemical vapor deposition (LPCVD), plasma enhanced chemical vapor deposition (PECVD) or atomic layer deposition (ALD). The gate insulator layer 53 preferably has a thickness of about 1-10 nm, although the actual thickness can be determined based on the circuit being implemented. The gate electrodes 70, 71 can be formed by depositing, patterning, and etching a layer of metal or polycrystalline silicon, preferably a layer of undoped polycrystalline silicon. The gate electrodes 70, 71 are formed overlying the N-well region 62 in the semiconductor layer 24 and generally have a height or thickness between 100 nm and 300 nm. The polycrystalline silicon can be deposited, for example, by the reduction of silane (SiH$_4$) in a CVD reaction such as a low pressure chemical vapor deposition (LPCVD).

As illustrated in FIG. 4, the PMOS transistors 31-33 which are formed in a first device region 260 have a first repeat distance (represented by double-headed arrow 240), whereas the PMOS transistors 31-35 which are formed in a second device region 270 have a second repeat distance (represented by double-headed arrow 250). The repeat distance between adjacent gate electrodes of one PMOS transistor and another adjacent neighbor PMOS transistor can be referred to as the "gate pitch" between gate electrodes. As used herein, the term "gate pitch" refers to the repeat distance between adjacent gate electrodes of adjacent transistors, which in the exemplary embodiment illustrated in FIG. 4, are illustrated as the distances 240, 250. In the exemplary embodiment shown in FIG. 4, the PMOS transistors 31-33 have a first "gate pitch" which is represented by the first repeat distance 240, whereas the PMOS transistors 34-35 have a second "gate pitch" which is represented by the second repeat distance 250. In the embodiment shown in FIGS. 4-15, the PMOS transistors 31-33 will be referred to as "narrow gate pitch transistors," whereas the PMOS transistors 34-35 will be referred to as "wide gate pitch transistors." However, the terms "narrow gate pitch" and "wide gate pitch" should not necessarily be construed to be limited to the particular embodiment illustrated in FIGS. 4-15. As used herein, the term "narrow gate pitch" transistor can refer to a transistor having a gate pitch that is approximately equal to the technology minimum, whereas the term "wide gate pitch" transistor can refer to a transistor having a gate pitch that is greater than the technology minimum. In FIGS. 4-15, for instance, the first repeat distance 240 generally refers to a repeat distance or "gate electrode pitch" which represents the current technology minimum that is allowed by the by the design rules of a specific processing technology; whereas the second repeat distance 250 generally refers to a repeat distance which represents a distance greater than the current technology minimum that is allowed by the by the design rules of a specific processing technology. In one exemplary embodiment for 45 nm CMOS technology, the first repeat distance 240 is approximately 190 nm or less, and the second repeat distance 250 is approximately 380 nm or less. In another exemplary embodiment for 32 nm CMOS technology or smaller, the first repeat distance 240 is approximately 130 nm or less, and the second repeat distance 250 is approximately 260 nm or less.

After the gate electrodes 70, 71 have been formed, a mask layer (not shown) can optionally be formed overlying the gate electrodes 70, 71, and at least a surface portion of the N-well regions 62 can be impurity doped with P-type conductivity determining impurities to create lightly doped extension regions 41, 43, as illustrated in FIG. 4. Impurity doping can take place, for example, by the implantation and subsequent thermal annealing of dopant ions such as boron di-flouride (BF$_2$).

Figure 5:
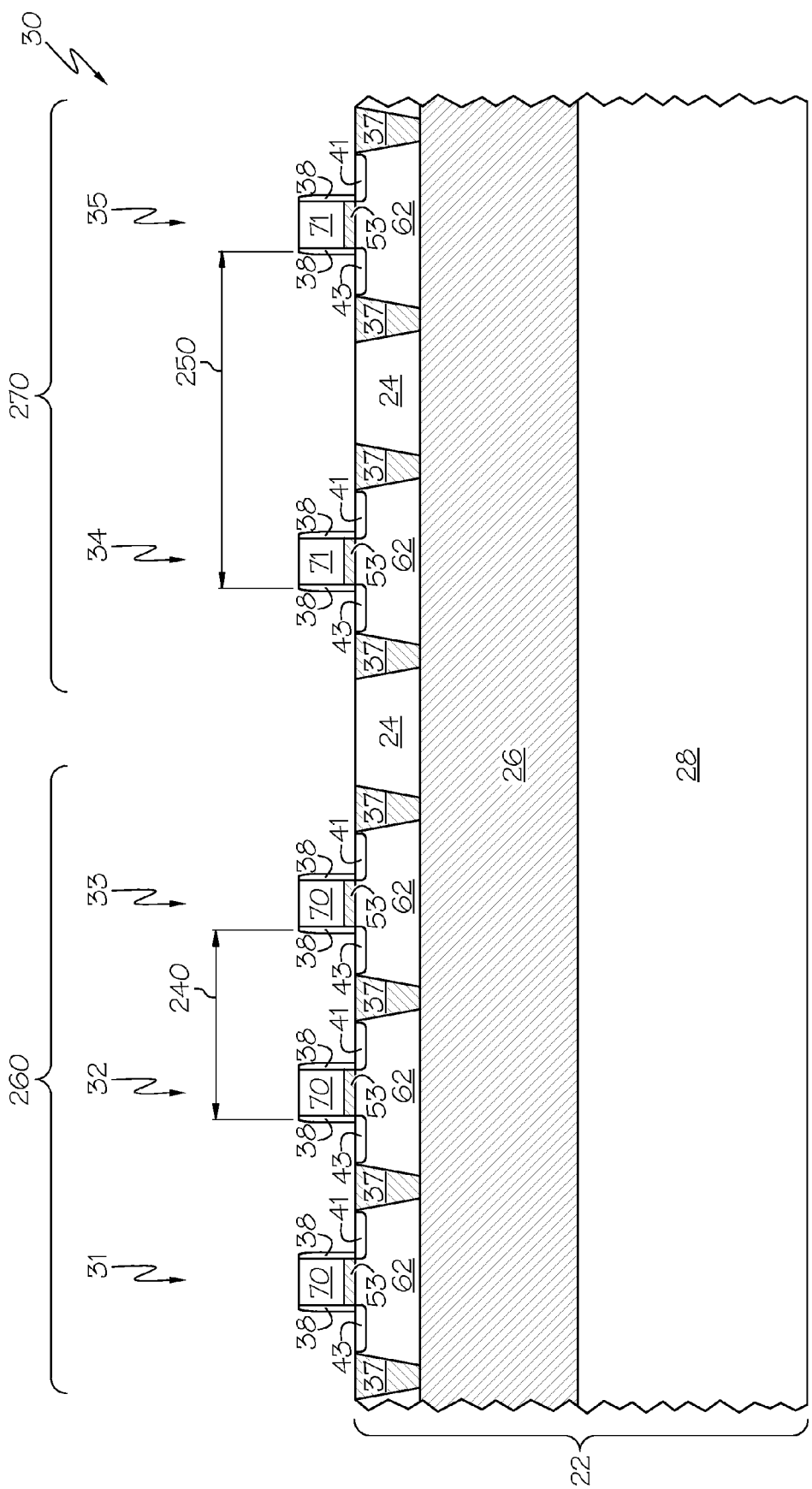

As illustrated in FIG. 5, sidewall spacers 38 are formed on the sidewalls of the various gate electrodes 70, 71. The sidewall spacers 38 are formed by depositing a layer of insulating material such as silicon oxide and/or silicon nitride and subsequently anisotropically etching the insulating layer, for example by reactive ion etching (RIE). Silicon oxide and silicon nitride can be etched, for example, in a CHF$_3$, CF$_4$, or SF$_6$ chemistry.

A layer of masking material, which can be, for example, a layer of photoresist, is applied and patterned to expose portions of each N-well region 62. Using this layer of patterned mask material as an ion implantation mask, P-type conductivity determining ions such as boron ions are implanted into the exposed portions of each N-well region 62 to form P-type source 42 and drain 44 regions, and into exposed portions of the gate electrodes 70, 71. For each of the transistor structures, the ion-implanted source and drain regions are self aligned with the gate electrodes.

Figure 6:
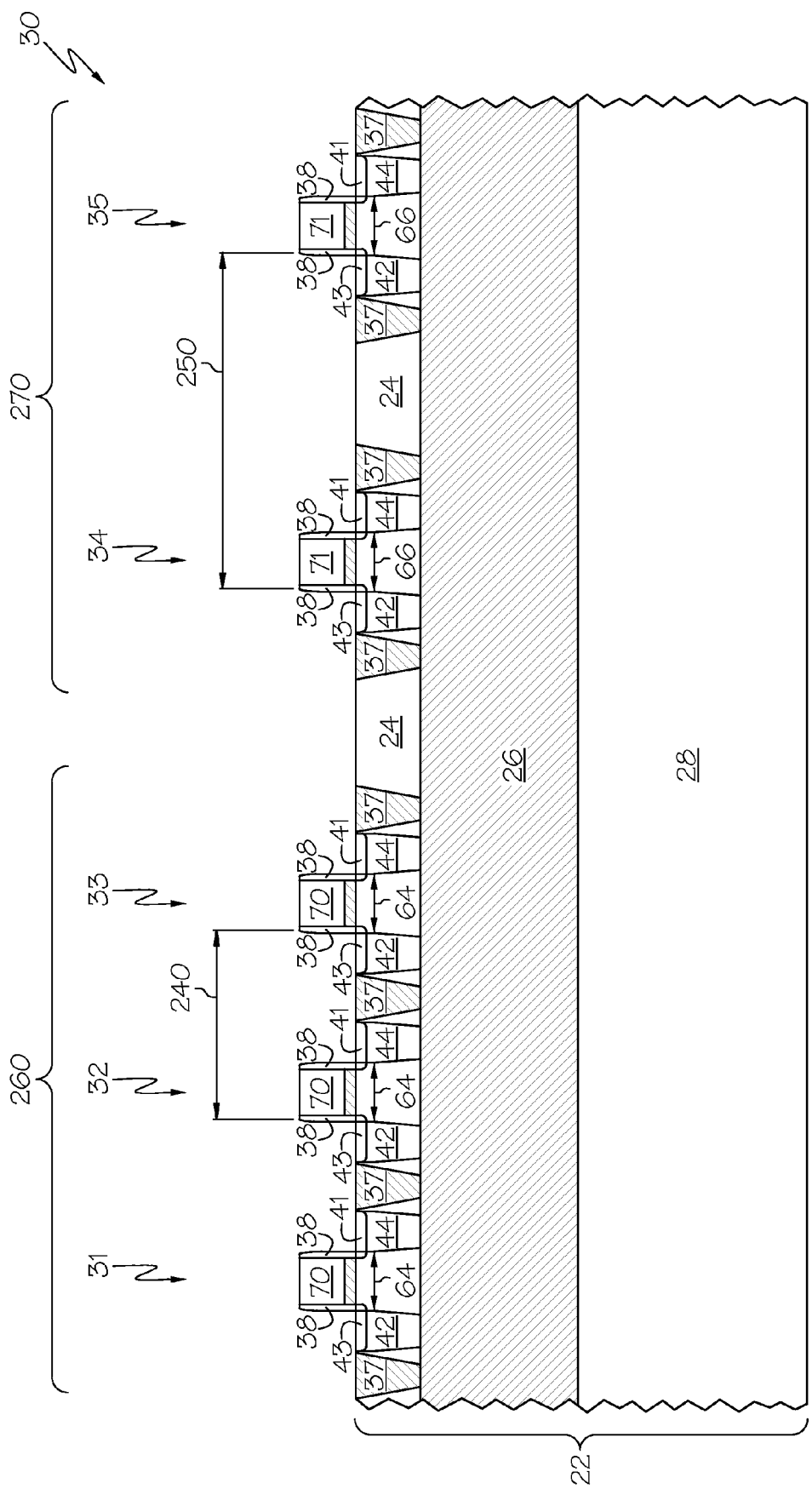

At the stage of processing shown in FIG. 6, the semiconductor substrate 24 includes a plurality of transistors 31-35. Each transistor includes active S/D regions 42, 44 formed therein and a gate electrode structure 38, 53, 70/71 formed thereon, where gate electrodes 70, 71 each define a channel 64, 66 of the respective transistors 31-35. As noted above, the transistors 31-35 are electrically isolated from each other by the dielectric isolation regions 37. Each of the gate electrode structures comprises a gate insulator layer 53, a gate electrode 70, 71 overlying the gate insulator layer 53, and spacers 38 adjacent a first sidewall and a second sidewall of the gate electrode 70, 71. In one embodiment, the gate electrode structure 38, 53, 70/71 has a height of approximately 100 nm, and a width of approximately 40 nm or less.

When a semiconductor device 30 includes transistors having different gate pitches, such as, semiconductor device 30, it is desirable to provide greater stress along the channel 66 of the wide gate pitch transistors 34, 35 to improve performance of the wide gate pitch transistors 34, 35. As will be described below with reference to FIGS. 7-15, methods are provided for fabricating a semiconductor device 30 which includes both narrow gate pitch MOS transistors 31-33 and wide gate pitch MOS transistors 34, 35 with enhanced stress overlying channel regions 66 of the wide gate pitch MOS transistors 34, 35. A semiconductor device 30 fabricated according to this method has enhanced stress applied over the wide gate pitch transistors 34, 35 without causing bridging issues with respect to the narrow gate pitch transistors 31-33.

Figure 7:
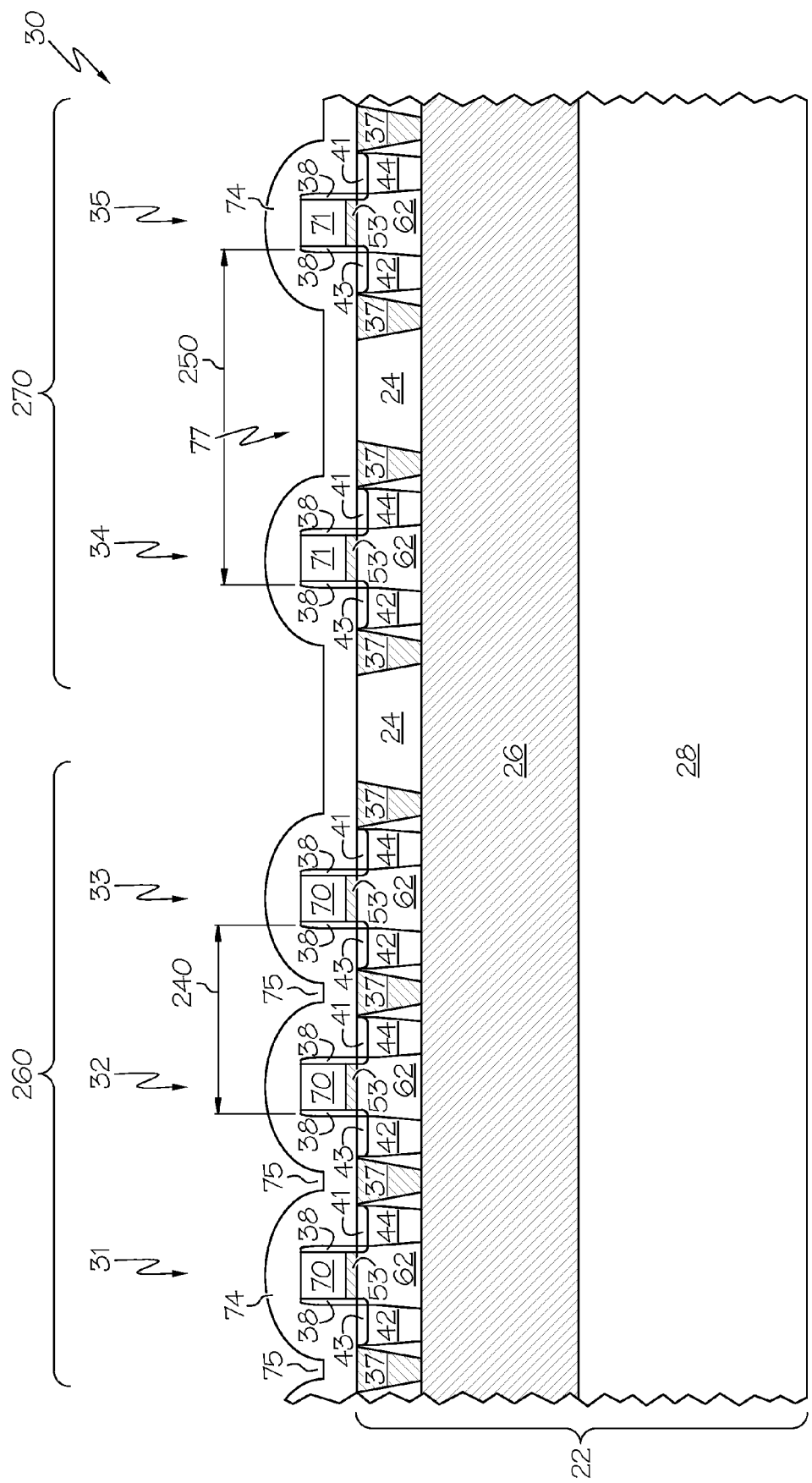

As illustrated in FIG. 7, an appropriate stress liner layer 74 for a given transistor conductivity type is conformally deposited overlying transistors 31-35 and the semiconductor layer 24, or overlying alternatively the oxide liner layer if present. The deposition conditions, reactants, and reactant flows can be adjusted, as is well known, to deposit either a tensile stress liner or a compressive stress liner. In the embodiment illustrated in FIG. 7, a compressive stress liner layer is blanket deposited overlying the PMOS transistors 31-35 to a thickness between 50 nm and 75 nm. The compressive stress liner layer 74 is formed of an appropriate electrically insulating material, such as, a layer of stressed silicon nitride (SiN). The layer of SiN can be deposited, for example, by LPCVD or PECVD from reactants including dichlorosilane and ammonia. Although not shown, the compressive stress liner layer 74 is then patterned to remove portions which overlie the NMOS transistor(s).

Figure 8:
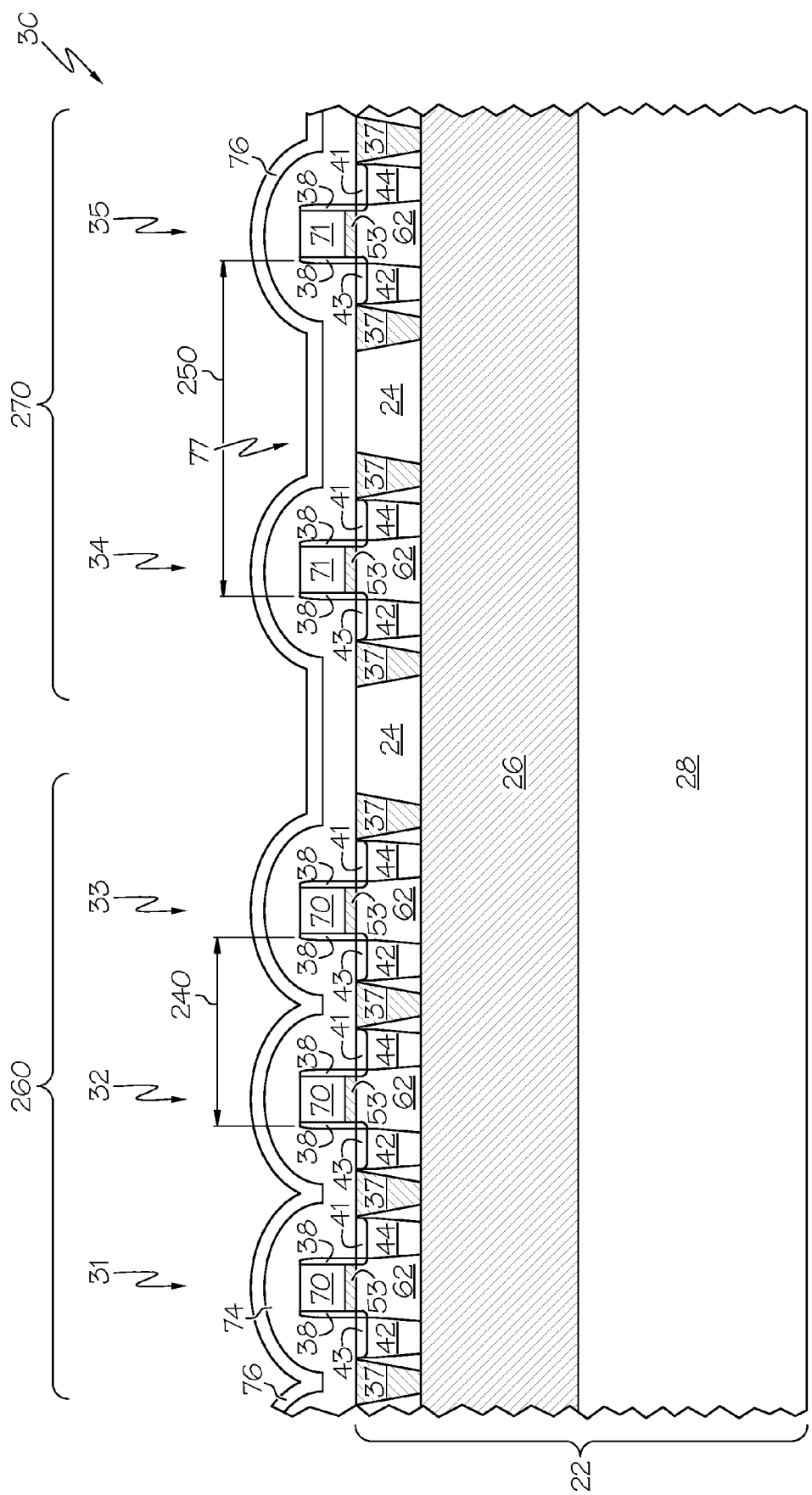

As illustrated in FIG. 8 and in accordance with one embodiment of the invention, a thin etch stop layer 76 is conformally blanket deposited overlying the first stress liner layer 74. The etch stop layer 76 can be an insulating material with a different etch rate than the compressive stress liner layer 74, for example, an oxide-based material such as silicon dioxide ($SiO_2$). The etch stop layer 76 can be deposited using techniques such as by chemical vapor deposition (CVD) to a thickness that is between approximately 3 nm and 6 nm. Because the first stress liner layer 74 and etch stop layer 76 are conformally deposited, the combined thickness of the compressive stress liner layer 74 and the etch stop layer 76 is substantially uniform throughout.

Figure 9:
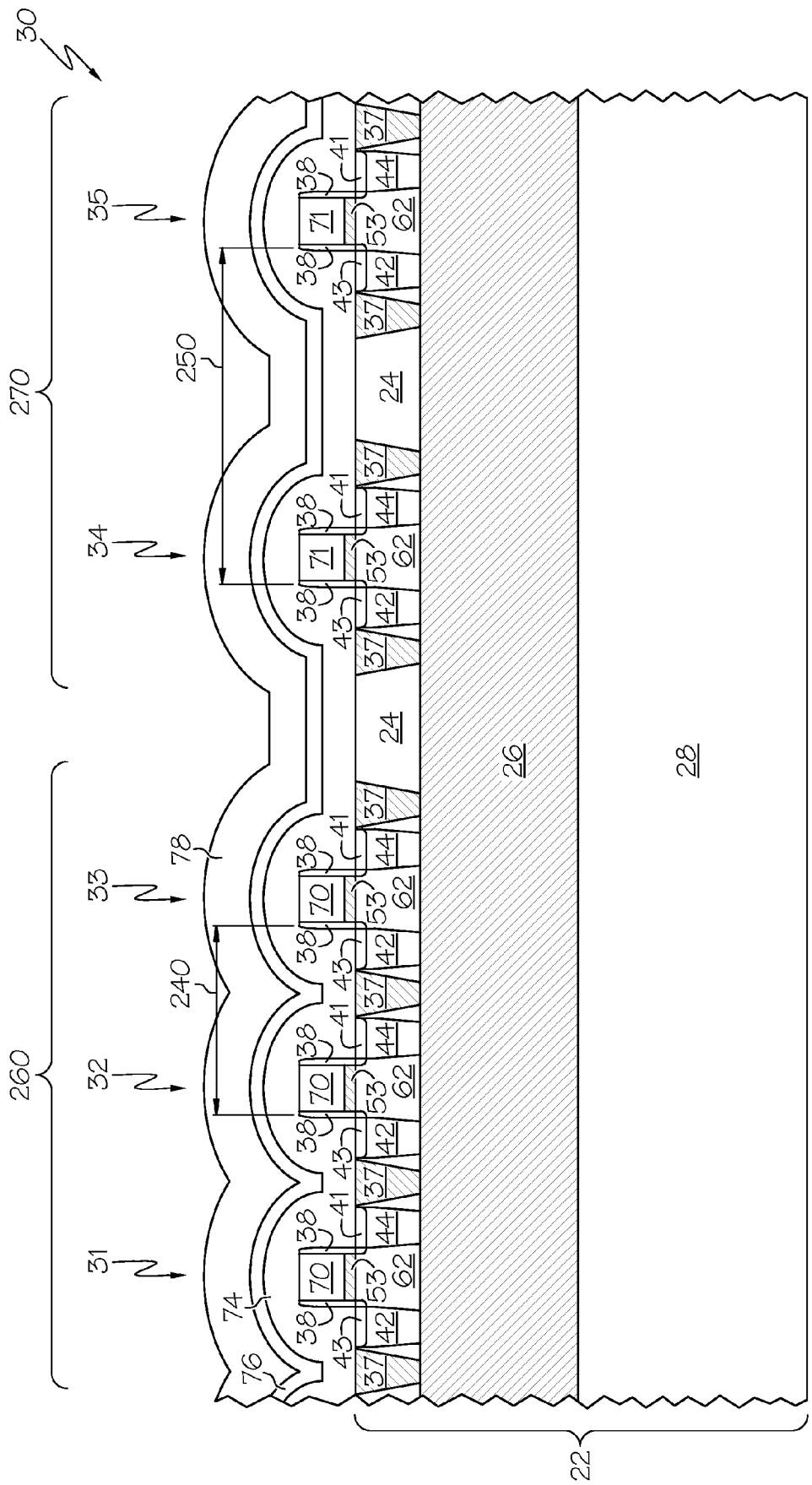

As illustrated in FIG. 9, a second stress liner layer 78 for a given transistor conductivity type is then conformally deposited overlying the etch stop layer 76. The second stress liner layer 78 is generally of the same stress type, tensile or compressive, as the first stress liner layer 74 which, for PMOS transistors, is a compressive stress liner layer 78. In accordance with the embodiment illustrated in FIG. 9, the compressive stress liner layer 78 is blanket deposited, to overlie the etch stop layer 76, preferably to a thickness between approximately 50 nm and 75 nm. As above, the compressive stress liner layer 78 is formed of an electrically insulating material, such as, a layer of stressed silicon nitride (SiN).

Figure 10:
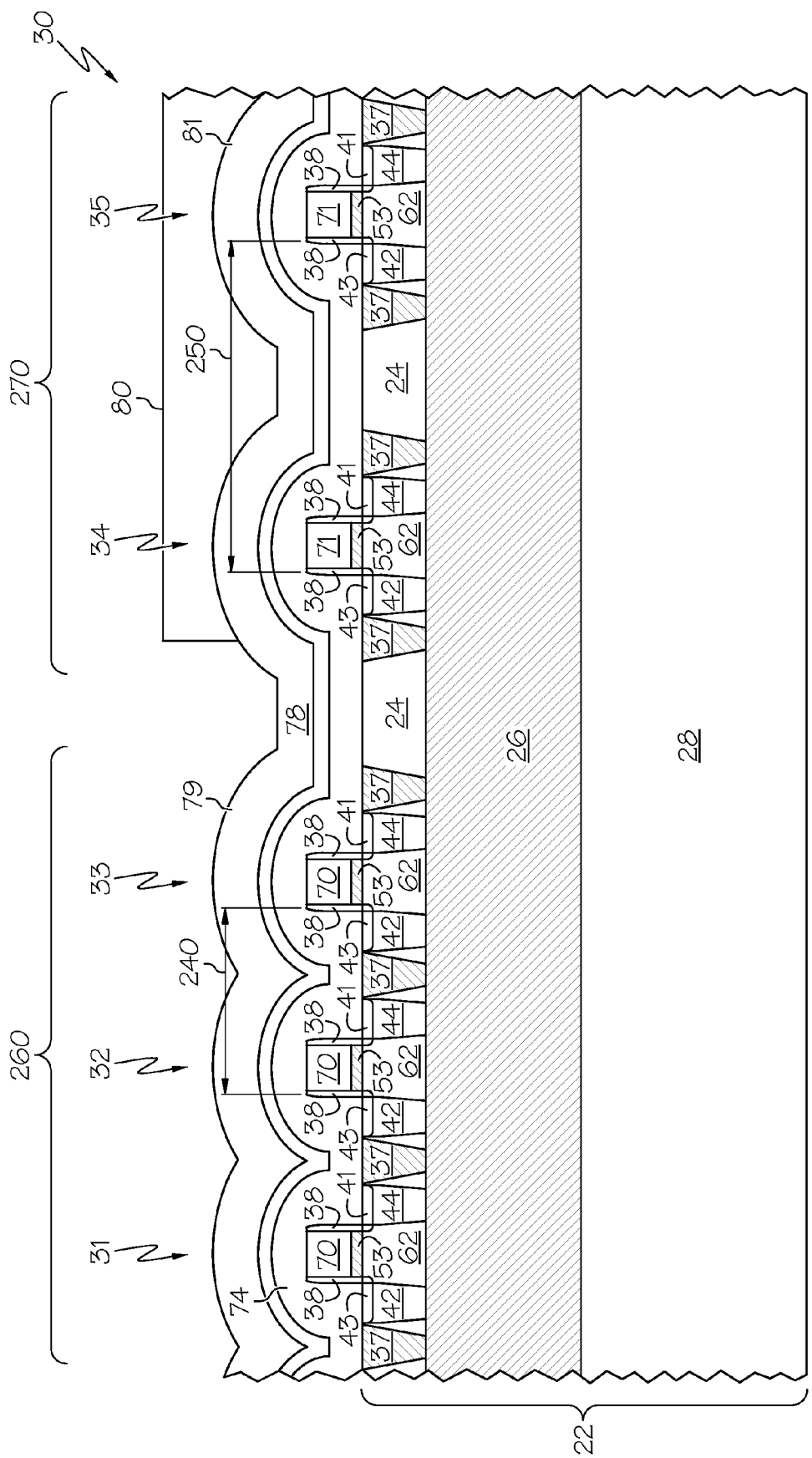

As illustrated in FIG. 10, a layer of masking material, which can be, for example, a layer of photoresist, is applied overlying the compressive stress liner layer 78 and patterned. Once patterned, the remaining, patterned masking material 80 exposes a portion 79 of the compressive stress liner layer 78 which overlies the narrow gate pitch PMOS transistor(s) 31-33 and covers the portion 81 of the compressive stress liner layer 78 which overlies the wide gate pitch PMOS transistor(s) 34-35. The patterned masking material 80 protects the portion 81 of the second stress liner layer 78 overlying the wide gate pitch MOS transistors 34-35 while allowing for removal of the exposed portion 79 of the second stress liner layer 78.

Figure 11:
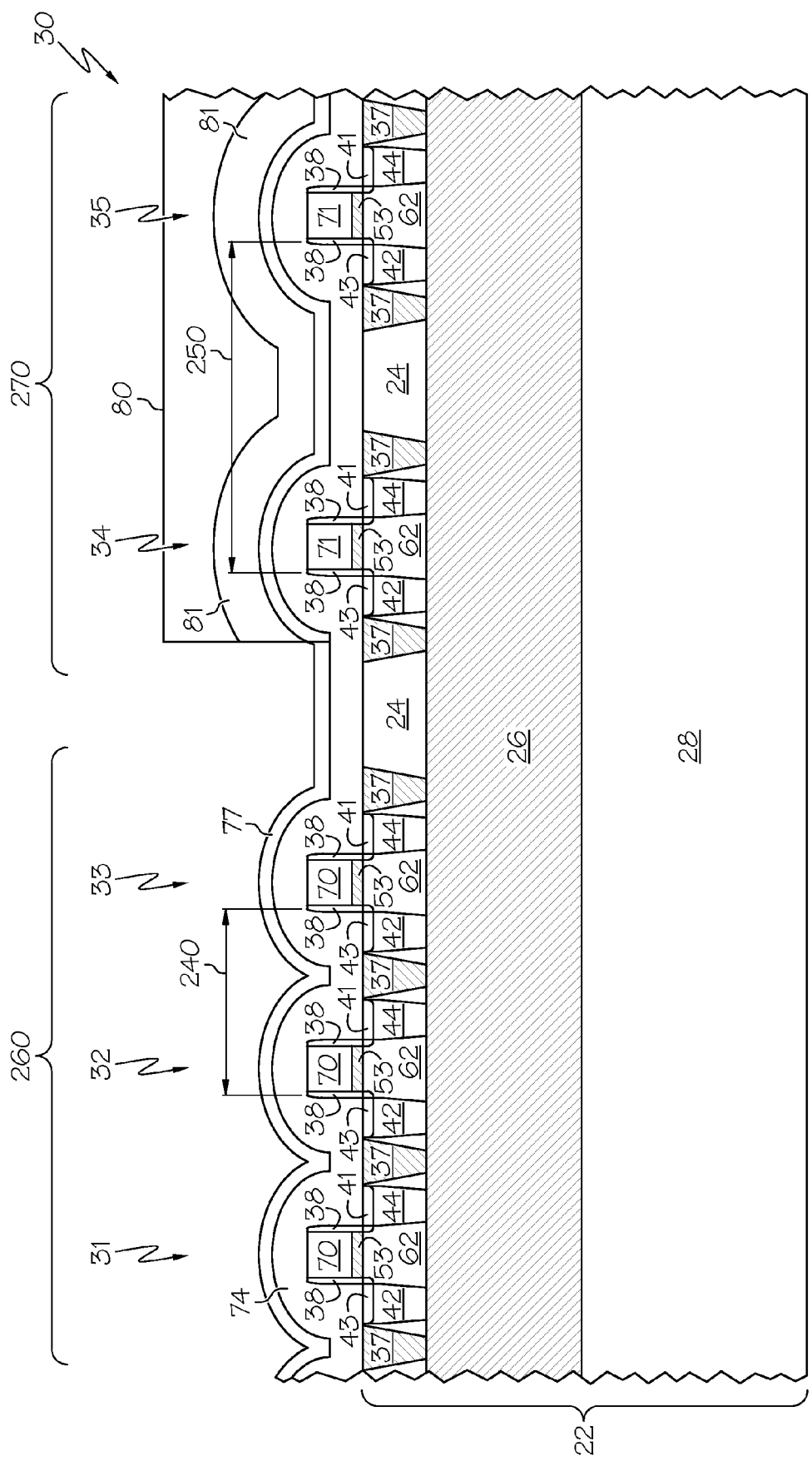

As illustrated in FIG. 11, the exposed portion 79 of the second compressive stress liner layer 78 overlying the narrow gate pitch PMOS transistor(s) 31-33 can be removed using an etching process which selectively stops upon reaching the etch stop layer 76 leaving a remaining portion 81 of the second compressive stress liner layer 78. When contacts 92 are eventually formed (FIG. 15), removing the exposed portion 79 of the second compressive stress liner layer 78 can reduce parasitic capacitance between the gates electrodes 70 and the contacts 92. In one embodiment, when the second compressive stress liner layer 78 comprises SiN and the etch stop layer 76 comprises an oxide-based material, such as silicon dioxide ($SiO_2$), the SiN layer can be etched using a plasma etching process which employs an etchant that can selectively etch SiN in contrast to the oxide etch stop layer 76. This way, the SiN material is removed but the oxide etch stop layer 76 remains after etching. Dry etch chemistries that can etch SiN selectively to $SiO_2$ include $SF_6$ and $CHF_3/CF_4$ mixtures.

Figure 12:
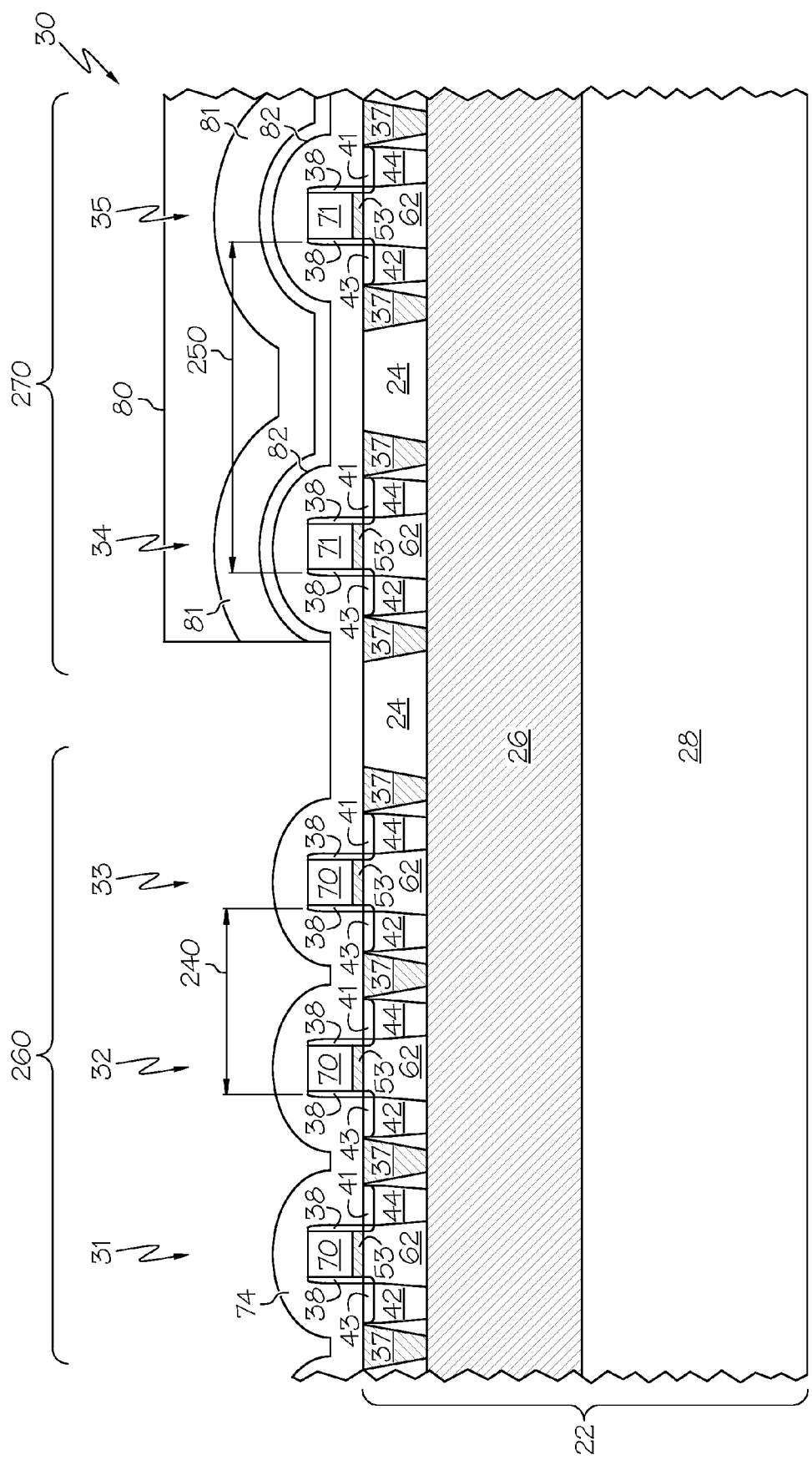
Figure 13:
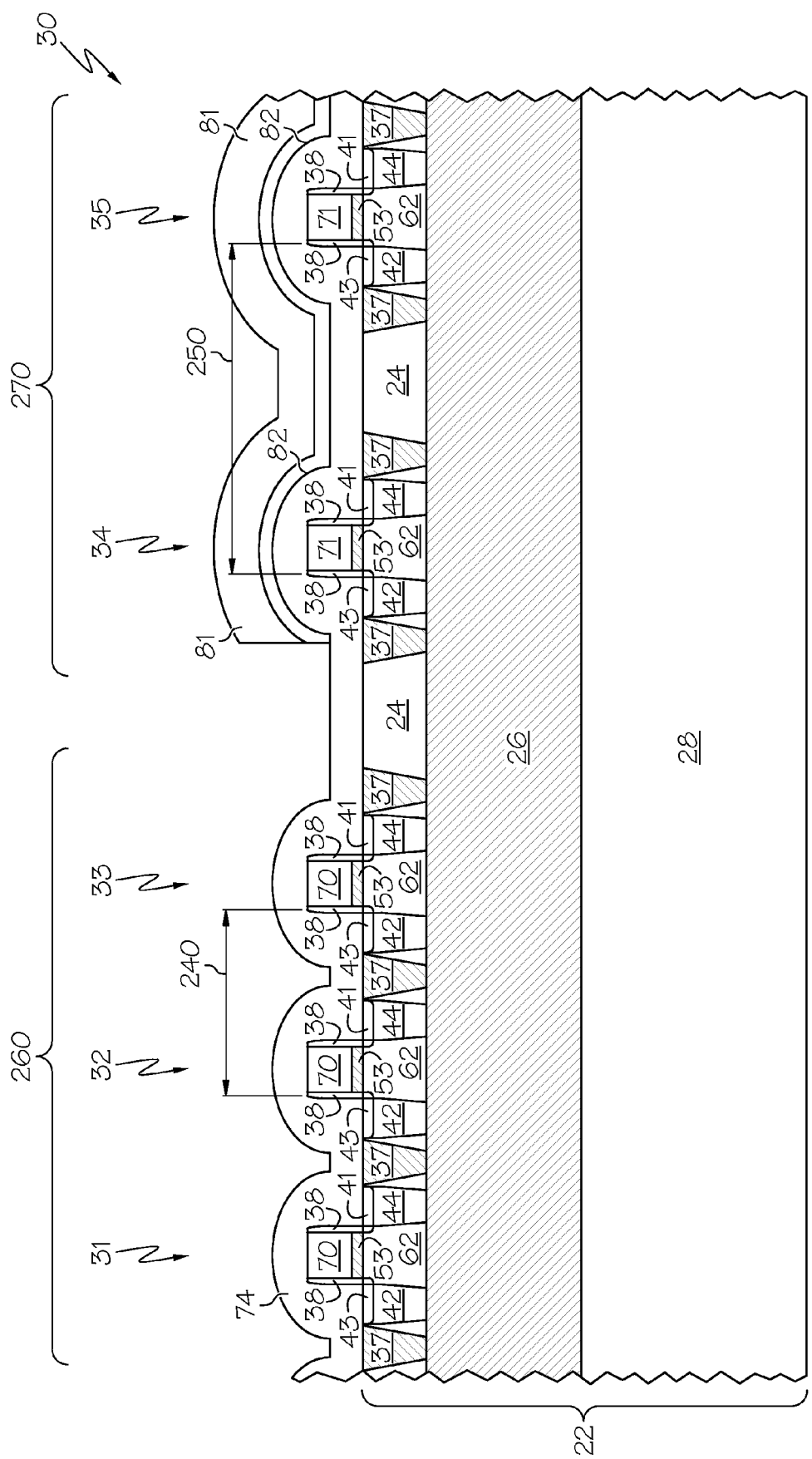

As illustrated in FIG. 12, the exposed portion 77 of the etch stop layer 76 overlying the narrow gate pitch PMOS transistor(s) 31-33 is removed using an etching process which selectively stops upon reaching the first compressive stress liner layer 74 leaving a remaining portion 82 of the etch stop layer 76. In one embodiment, the etching process can be a wet etching process which uses dilute HF as an etchant. As illustrated in FIG. 13, the patterned masking material 80 which overlies the wide gate pitch PMOS transistor(s) 34-35 is removed, for example, by plasma ashing.

Thus, in accordance with the method illustrated in FIGS. 1-13, a semiconductor device 30 is provided which comprises a semiconductor substrate 24, a plurality of transistors 31-35 formed on and in the semiconductor substrate 24, a first stress liner layer 74, and a second stress liner layer 78. The plurality of transistors 31-35 comprise a plurality of narrow gate pitch transistors 31-33 each comprising a first gate electrode 70 and a first channel region 64, and a plurality of wide gate pitch transistors 34-35 each comprising a second gate electrode 71 and a second channel region 66. Adjacent ones of the first gate electrodes 70 are spaced apart by a first repeat distance 240; and adjacent ones of the second gate electrodes 71 are spaced apart by a second repeat distance 250 greater than the first distance 240. The first stress liner layer 74 overlies the narrow gate pitch transistors 31-33, the wide gate pitch transistors 34-35 and the semiconductor layer 24, while the second stress liner layer 81 overlies a portion of the first stress liner layer 74 which overlies only the wide gate pitch transistors 34-35. As such, a combined thickness of the first stress liner layer 74 and the second stress liner layer 81 overlying the wide gate pitch transistors 34, 35 is greater than the thickness of the first stress liner layer 74 overlying the narrow gate pitch transistors 31-33. As a result, the mobility of majority charge carrier in the second channel regions 66 of the wide gate pitch transistors 34, 35 is greater than the mobility of majority charge carrier in the first channel regions 64 of the narrow gate pitch transistors 31-33.

For example, in one embodiment, because the thickness of the compressive stress liner layers 74, 81 overlying the wide gate pitch PMOS transistors 34, 35 is greater than the thickness of the stress liner layer 74 overlying the narrow gate pitch PMOS transistors 31-33, the mobility of majority carrier holes through the channel regions 66 of the wide gate pitch PMOS transistors 34, 35 is enhanced to produce a higher device drain current which improves device performance.

Figure 14:
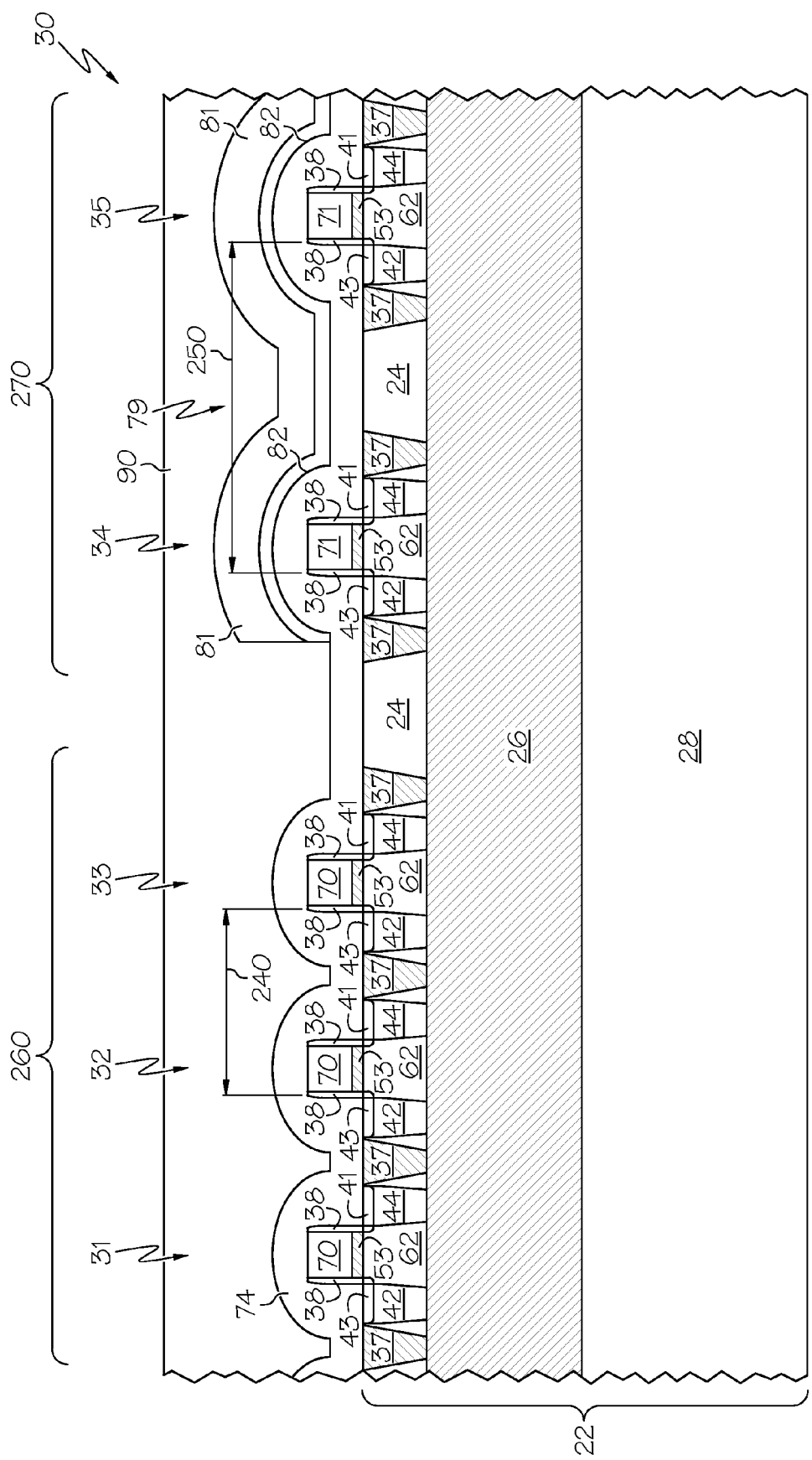
Figure 15:
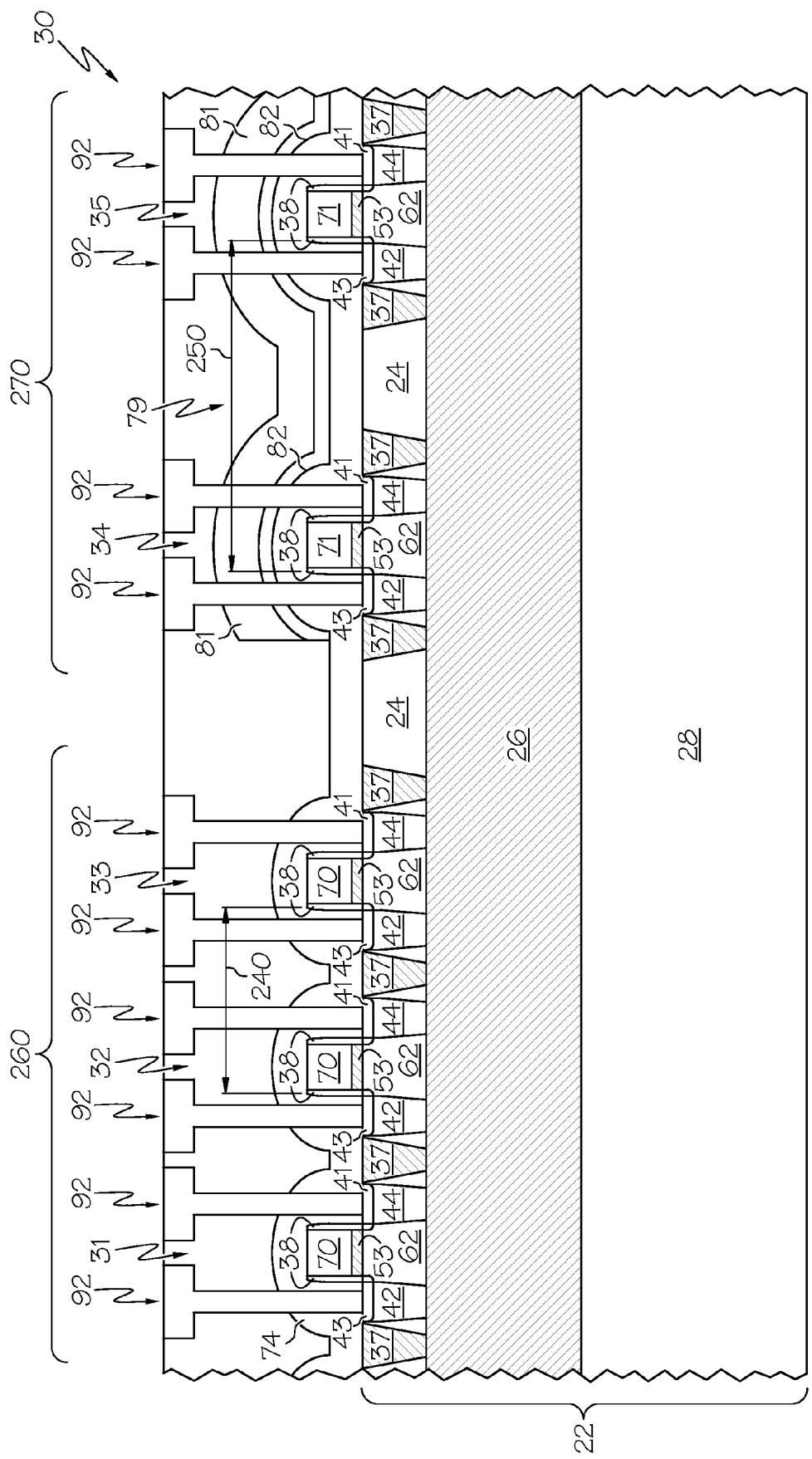

As illustrated in FIGS. 14 and 15, the stress enhanced semiconductor device 30 can be completed in conventional manner. Conventional steps include, for example, forming metal silicide contacts on the source and drain regions, depositing interlayer dielectric layers, planarizing the interlayer dielectric layers, and etching contact vias or openings through the dielectric layer to the metal silicide contacts. Electrical contact to the source and drain regions 42, 44 and the gate electrodes 70, 71 can then be made by contact plugs formed in contact openings and by interconnect metal deposition and patterning.

For example, as illustrated in FIG. 14, an interlevel dielectric (ILD) layer 90 which can be, for example, a low dielectric constant (κ) dielectric film layer 90 is blanket deposited overlying the exposed portion of the first compressive stress liner layer 74 and the remaining portion of the second compressive stress liner layer 81. The upper surface of the low κ dielectric film layer 90 can then optionally be polished to remove topographically irregular portions of the low κ dielectric film layer 90 and to make the topography of the upper surface of the low κ dielectric film layer 90 substantially uniform and planar. In some embodiments the low κ dielectric film layer 90 has a dielectric constant, for example, between 2.7 and 3.9. The upper surface of the low κ dielectric film layer 90 can be polished using, for example, chemical mechanical polishing (CMP).

As illustrated in FIG. 15, with respect to each PMOS transistor 31-35, contacts 92 can then be formed in the contact holes (not shown) to contact regions overlying the active source/drain regions 42, 44 of the semiconductor substrate 24. Although not illustrated in the cross section of FIG. 15, contact holes (not shown) can also be formed to contact regions overlying the gate electrodes 70, 71. A conductive layer (not shown) can be blanket deposited in the lined contact holes and overlying the remaining portions of the ILD layer 90 until the lined contact holes are filled. Any excess portions of the conductive layer which overlie the barrier metal liner layer (if used) and/or the ILD layer 90, can be removed by etching or by chemical-mechanical polishing (CMP) until a surface of ILD layer 90 is exposed or until a desired thickness of the conductive material 92 in the contact holes is realized. After the excess portions of the conductive layer have been removed, the remaining portions of the conductive layer comprise the contacts 92 to contact regions (not shown) for the gate electrodes 70, 71 and the active source/drain regions 42, 44 of the semiconductor substrate 24.

In alternative embodiments not shown, the similar techniques can be used to fabricate a semiconductor device including NMOS transistors. In such embodiments, the thin monocrystalline layer of silicon can be a silicon substrate having a <100> surface crystal orientation which is the preferred crystallographic orientation when fabricating NMOS devices, and the semiconductor layer can be doped with P-type conductivity determining impurities to create P-well regions (not shown) in the semiconductor layer 24. Impurity doping can take place, for example, by the implantation and subsequent thermal annealing of dopant ions such as boron. The P-well regions can be impurity doped with N-type conductivity determining impurities to create lightly doped extension regions adjacent the gate insulator layers 53. In such embodiments, impurity doping can take place, for example, by the implantation and subsequent thermal annealing of dopant ions such as phosphorus or arsenic. Similarly, source and drain regions can be formed for NMOS transistors (not shown) by removing the patterned layer of masking material overlying the NMOS transistors, applying and patterning another layer of masking material overlying the PMOS transistors to mask the PMOS transistor structures 31-35 and to expose portions of the P-well region of each of the NMOS transistor. Using this patterned masking material as an ion implantation mask, N-type conductivity determining ions are implanted into exposed portions of each P-well region to form N-type source and drain regions in the exposed portions of each P-well region, and into exposed portions of the gate electrodes of the NMOS transistors. The implanted ions can be either phosphorus or arsenic ions. For the NMOS transistors, tensile stress liner layers can be deposited overlying NMOS transistor(s), and patterned to remove portions which overlie the PMOS transistor(s) 31-35. The combined thickness of the multiple tensile stress liner layers overlying wide gate pitch NMOS transistors enhances the mobility of majority carrier electrons through the channel regions of the wide gate pitch NMOS transistors to produce a higher device drain current which improves device performance.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method of fabricating a semiconductor device, the method comprising:
    providing a semiconductor substrate and a plurality of transistors formed on and in the semiconductor substrate, wherein the plurality of transistors comprise narrow gate pitch transistors and wide gate pitch transistors, wherein narrow gate pitch transistors each comprise a first gate electrode and the wide gate pitch transistors each comprise a second gate electrode, and wherein adjacent ones of the first gate electrodes are spaced apart by a first distance, and wherein adjacent ones of the second gate electrodes are spaced apart by a second distance greater than the first distance;
    conformally depositing a first stress liner layer overlying the narrow gate pitch transistors, the wide gate pitch transistors and the semiconductor layer;
    conformally depositing an etch stop layer overlying the first stress liner layer, wherein the etch stop layer etches selectively with respect to the first stress liner layer;
    conformally depositing a second stress liner layer overlying the etch stop layer, wherein the second stress liner layer etches selectively with respect to the etch stop layer; and
    removing a portion of the second stress liner layer which overlies the narrow gate pitch transistors to expose an exposed portion of the etch stop layer which overlies the narrow gate pitch transistor.

2. A method according to claim 1, wherein the step of removing the exposed portion of the second stress liner layer, comprises:
    plasma etching the exposed portion of the second stress liner layer which overlies the narrow gate pitch transistors to expose the exposed portion of the etch stop layer which overlies the narrow gate pitch transistor, wherein the plasma etching selectively stops upon reaching the etch stop layer and leaves a remaining portion of the second stress liner layer that overlies a remaining portion of the etch stop layer.

3. A method according to claim 1, wherein the narrow gate pitch transistors comprise P-channel narrow gate pitch transistors, wherein the wide gate pitch transistors comprise P-channel wide gate pitch transistors, wherein the first stress liner layer comprises a first compressive stress liner layer, and wherein the second stress liner layer comprises a second compressive stress liner layer.

4. A method according to claim 1, wherein the narrow gate pitch transistors comprise N-channel narrow gate pitch transistors, wherein the wide gate pitch transistors comprise N-channel wide gate pitch transistors, wherein the first stress liner layer comprises a first tensile stress liner layer, and wherein the second stress liner layer comprises a second tensile stress liner layer.

5. A method according to claim 1, wherein a thickness of the first stress liner layer is selected to prevent bridging of the first stress liner layer between the first gate electrodes of the narrow gate pitch transistors.

6. A method according to claim 1, wherein the first stress liner layer comprises a layer of stressed silicon nitride (SiN), and wherein the etch stop layer comprises a layer of oxide-based material.

7. A method according to claim 2, further comprising the step of:

wet etching the exposed portion of the etch stop layer which overlies the narrow gate pitch transistors to expose an exposed portion of the first stress liner layer overlying the narrow gate pitch transistors, wherein the wet etching selectively stops upon reaching the first compressive first stress liner layer leaving a remaining portion of the etch stop layer which overlies the wide gate pitch transistors.

8. A method according to claim 7, wherein a combined thickness of the first stress liner layer and the second stress liner layer overlying the wide gate pitch transistors is greater than a thickness of the first stress liner layer overlying the narrow gate pitch transistors such that mobility of majority charge carrier in channel regions of the wide gate pitch transistors is greater than the mobility of majority charge carrier in channel regions of the narrow gate pitch transistors.

9. A method according to claim 1, wherein the first distance corresponds to a gate electrode pitch that is substantially equal to the minimum allowed by a specific processing technology.

10. A method according to claim 9, wherein the second distance corresponds to a gate electrode pitch that is greater than the minimum allowed by the specific processing technology.

11. A method of fabricating a stress enhanced semiconductor device comprising narrow gate pitch transistors and wide gate pitch transistors, the method comprising:
providing a semiconductor substrate and a plurality of transistors formed on and in the semiconductor substrate, wherein the plurality of transistors comprise a plurality of narrow gate pitch transistors formed in a first device region and a plurality of wide gate pitch transistors formed in a second device region, wherein narrow gate pitch transistors each comprise a first gate electrode and the wide gate pitch transistors each comprise a second gate electrode, and wherein adjacent ones of the first gate electrodes are spaced apart by a first distance, and wherein adjacent ones of the second gate electrodes are spaced apart by a second distance greater than the first distance;
conformally depositing a first stress liner layer overlying the first device region and the second device region;
conformally depositing an etch stop layer overlying the first stress liner layer, wherein the etch stop layer etches selectively with respect to the first stress liner layer;
conformally depositing a second stress liner layer overlying the etch stop layer, wherein the second stress liner layer etches selectively with respect to the etch stop layer;
applying a layer of masking material overlying the second stress liner layer;
removing a portion of the layer of masking material to expose an exposed portion of the second stress liner layer which overlies the first device region, wherein a remaining portion of the layer of masking material covers a covered portion of the second stress liner layer which overlies the second device region;
plasma etching the exposed portion of the second stress liner layer which overlies the first device region to expose the exposed portion of the etch stop layer which overlies the first device region, wherein the plasma etching selectively stops upon reaching the etch stop layer and leaves a remaining portion of the second stress liner layer; and
wet etching the exposed portion of the etch stop layer which overlies the first device region to expose an exposed portion of the first stress liner layer overlying the first device region, wherein the wet etching selectively stops upon reaching the first compressive first stress liner layer leaving a remaining portion of the etch stop layer which overlies a remaining portion of the first stress liner layer in the second device region.

12. A method according to claim 11, wherein the first stress liner layer comprises a first layer of stressed silicon nitride (SiN), wherein the second stress liner layer comprises a second layer of stressed silicon nitride (SiN), and wherein the etch stop layer comprises a layer of oxide-based material.

13. A method according to claim 11, wherein a thickness of the first stress liner layer is selected to prevent bridging of the first stress liner layer between the first gate electrodes of the narrow gate pitch transistors, wherein a combined thickness of the first stress liner layer and the second stress liner layer overlying the second device region is greater than the thickness of the first stress liner layer overlying the first device region such that mobility of majority charge carrier in channel regions of the wide gate pitch transistors is greater than the mobility of majority charge carrier in channel regions of the narrow gate pitch transistors.

14. A method according to claim 11, wherein the narrow gate pitch transistors comprise P-channel narrow gate pitch transistors, wherein the wide gate pitch transistors comprise P-channel wide gate pitch transistors, wherein the first stress liner layer comprises a first compressive stress liner layer, and wherein the second stress liner layer comprises a second compressive stress liner layer.

15. A method according to claim 11, wherein the narrow gate pitch transistors comprise N-channel narrow gate pitch transistors, wherein the wide gate pitch transistors comprise N-channel wide gate pitch transistors, wherein the first stress liner layer comprises a first tensile stress liner layer, and wherein the second stress liner layer comprises a second tensile stress liner layer.

16. A method of fabricating a semiconductor device, the method comprising:
providing a semiconductor substrate;
forming a plurality of narrow gate pitch transistors and wide gate pitch transistors on and in the semiconductor substrate, wherein the narrow gate pitch transistors are spaced apart by a first distance, and wherein the wide gate pitch transistors are spaced apart by a second distance greater than the first distance;
conformally depositing a first stress liner layer overlying the narrow gate pitch transistors, the wide gate pitch transistors and the semiconductor layer, conformally depositing an etch stop layer overlying the first stress liner layer, wherein the etch stop layer etches selectively with respect to the first stress liner layer, and conformally depositing a second stress liner layer overlying the etch stop layer, wherein the second stress liner layer etches selectively with respect to the etch stop layer; and
removing an exposed portion of the second stress liner layer which overlies the narrow gate pitch transistor to expose an exposed portion of the etch stop layer and to leave a remaining portion of the second stress liner layer that overlies another portion of the etch stop layer and the wide gate pitch transistors.

17. A method according to claim 16, wherein the narrow gate pitch transistors comprise P-channel narrow gate pitch transistors, wherein the wide gate pitch transistors comprise P-channel wide gate pitch transistors, wherein the first stress liner layer comprises a first compressive stress liner layer, and wherein the second stress liner layer comprises a second compressive stress liner layer.

18. A method according to claim 16, wherein the narrow gate pitch transistors comprise N-channel narrow gate pitch transistors, wherein the wide gate pitch transistors comprise N-channel wide gate pitch transistors, wherein the first stress liner layer comprises a first tensile stress liner layer, and wherein the second stress liner layer comprises a second tensile stress liner layer.

* * * * *